(12) United States Patent
Matsuno et al.

(10) Patent No.: US 11,088,073 B2
(45) Date of Patent: Aug. 10, 2021

(54) SEMICONDUCTOR DEVICE

(71) Applicant: Mitsubishi Electric Corporation, Tokyo (JP)

(72) Inventors: Yoshinori Matsuno, Tokyo (JP); Toshikazu Tanioka, Tokyo (JP); Yasunori Oritsuki, Tokyo (JP); Kenichi Hamano, Tokyo (JP); Naochika Hanano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/782,547

(22) Filed: Feb. 5, 2020

(65) Prior Publication Data

US 2020/0303296 A1    Sep. 24, 2020

(30) Foreign Application Priority Data

Mar. 22, 2019  (JP) ............................ JP2019-054788

(51) Int. Cl.
| | |
|---|---|
| *H01L 23/528* | (2006.01) |
| *H01L 29/78* | (2006.01) |
| *H01L 23/532* | (2006.01) |
| *H01L 23/34* | (2006.01) |
| *H01L 23/485* | (2006.01) |
| *H01L 29/20* | (2006.01) |
| *H01L 29/16* | (2006.01) |

(52) U.S. Cl.
CPC .......... *H01L 23/528* (2013.01); *H01L 23/34* (2013.01); *H01L 23/485* (2013.01); *H01L 23/53271* (2013.01); *H01L 29/7815* (2013.01); *H01L 29/1602* (2013.01); *H01L 29/1608* (2013.01); *H01L 29/2003* (2013.01)

(58) Field of Classification Search
CPC ..... H01L 23/528; H01L 23/34; H01L 23/485; H01L 23/53271; H01L 29/7815; H01L 29/1602; H01L 29/1628
USPC .............................. 257/77, 76; 438/105, 931
See application file for complete search history.

(56) References Cited

U.S. PATENT DOCUMENTS

2013/0026494 A1\* 1/2013 Oritsuki et al. .... H01L 29/7803
257/77
2019/0259845 A1   8/2019 Oritsuki et al.

FOREIGN PATENT DOCUMENTS

WO       2018055719 A1    3/2018

\* cited by examiner

*Primary Examiner* — Thinh T Nguyen
(74) *Attorney, Agent, or Firm* — Studebaker & Brackett PC

(57) ABSTRACT

In some examples, a semiconductor device includes a substrate, an interlayer insulating film, a gate pad provided on the interlayer insulating film, a source electrode that is provided on the interlayer insulating film, source wiring provided on the interlayer insulating film, and gate wiring that is provided on the interlayer insulating film and is electrically connected to the gate pad. The size of the source wiring is not increased, and a high impurity concentration region having a higher impurity concentration than a drift layer is formed on the surface of the substrate at a location directly below the gate pad.

19 Claims, 7 Drawing Sheets

SEMICONDUCTOR DEVICE

BACKGROUND

Field

Examples are described which relate to a semiconductor device.

Background Art

For example, SiC metal oxide semiconductor field effect transistors (MOSFETs) are required to achieve fast switching with low switching loss. The fast switching means high dV/dt. If fast switching occurs, high potential occurs directly below the gate wiring or gate pad, and the risk of deterioration of the interlayer insulating film increases. A conventional measure against the risk of deterioration is to provide source wiring at the same potential as the source so as to surround the area directly below the gate wiring or gate pad.

SiC has a dielectric breakdown field ten times higher than that of Si. Therefore, when SiC is used, the risk of high potential occurring directly below the gate wiring or gate pad when dV/dt is high is higher than when Si is used. In addition, with the structure in which the source wiring is provided around the gate wiring, the ratio of the effective area to the chip area tends to be low. The effective area is a current carrying area. Since SiC is more expensive than Si, the structure and layout need to be optimally designed. The smaller the chip, the more significant the effect of the design on the cost becomes.

WO2018/055719A1 describes in the paragraph 0042 as follows: "as shown by the arrow VC in FIG. 3, the displacement current that occurs in the outer peripheral well region 9 when the silicon carbide MOSFET 100 is switched from the on state to the off state flows also to the outer peripheral contact region 8 below the source wiring 13, so that the path of the displacement current is shortened, and the potential difference that occurs below the gate pad due to the displacement current occurring upon switching can be reduced (the potential gradient can be reduced). In this way, dielectric breakdown of the insulating film below the gate pad can be prevented".

With the structure in which the source wiring is provided around the gate wiring described above, the ratio of the effective area to the chip area decreases. There is a demand for a semiconductor device that can reduce deterioration of the interlayer insulating film while increasing the ratio of the effective area to the chip area.

SUMMARY

Some examples described herein may address the above-described problems. Some examples described herein may provide a semiconductor device that can reduce deterioration of an interlayer insulating film while increasing the ratio of the effective area to the chip area.

In some examples, a semiconductor device includes a substrate, an interlayer insulating film provided on the substrate, a gate pad provided on the interlayer insulating film, a source electrode that is provided on the interlayer insulating film and is opposed to a part of the gate pad in plan view, source wiring having a linear shape that is provided on the interlayer insulating film, is not opposed to the source electrode but is opposed to a part of the gate pad in plan view, and is connected to the source electrode, and gate wiring that is provided on the interlayer insulating film and is electrically connected to the gate pad, wherein the substrate includes a drift layer of a first conductivity type, a well layer of a second conductivity type provided on the drift layer, and a high impurity concentration region provided on the well layer at a location directly below the gate wiring and the gate pad, the first conductivity type impurity concentration of the high impurity concentration region is higher than the first conductivity type impurity concentration of the drift layer, and the source wiring and the gate wiring provide one frame that surrounds the source electrode in plan view.

Other and further objects, features and advantages will appear more fully from the following description.

DETAILED DESCRIPTION

Figure 1:
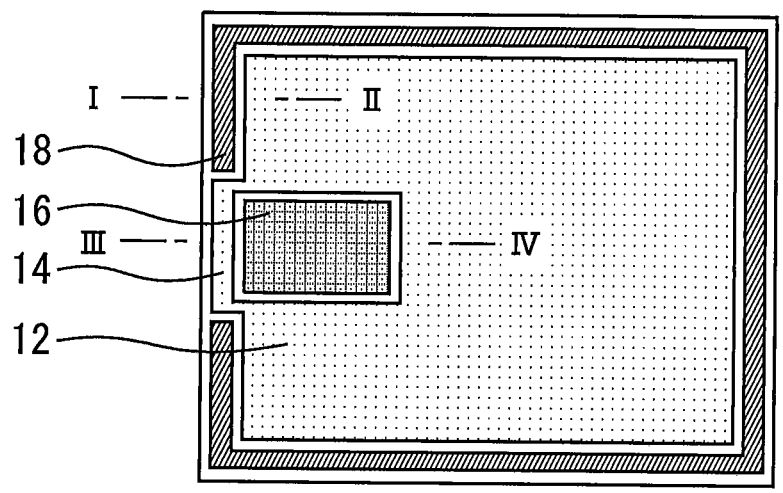
FIG. 1 is a plan view of a semiconductor device according to a first embodiment.

Semiconductor devices according to embodiments will be described with reference to the drawings. The same or corresponding components are denoted by the same reference numerals, and redundant descriptions thereof may be omitted.

First Embodiment

FIG. 1 is a plan view of a semiconductor device according to a first embodiment. The semiconductor device is a rectangular chip in which a metal oxide semiconductor field effect transistor (MOSFET) or an insulated gate bipolar transistor (IGBT) is formed, for example. The outermost rectangular frame represents the outer edge of the chip. The semiconductor device includes a source electrode 12 and source wiring 14 connected to the source electrode 12. The source wiring 14 has a linear elongated shape. In plan view, the source wiring 14 is in contact with the source electrode 12 at the opposite ends thereof.

A gate pad 16 is arranged at a position where the gate pad 16 is surrounded by the source electrode 12 and the source wiring 14. Gate wiring 18 is electrically connected to the gate pad 16. The gate wiring 18 is made of Al, for example. The gate pad 16 and the gate wiring 18 are not directly connected to each other, as shown in FIG. 1. A wire or lead is connected to the gate pad 16, and the gate pad 16 receives a gate voltage via the wire or lead. The gate voltage applied to the gate pad 16 is applied to a plurality of gate electrodes arranged below the source electrode 12 via the gate wiring 18.

In plan view, the source wiring 14 and the gate wiring 18 provide one frame that surrounds the source electrode 12. In other words, the source wiring 14 is located between the gate pad 16 and the outer edge of the chip, and the gate wiring 18 is located between the source electrode 12 and the outer edge of the chip. The source electrode 12 and the source wiring 14 surround the gate pad 16 but do not surround the gate wiring 18. In plan view, the source electrode 12 is opposed to a part of the gate pad 16, and the source wiring 14 is not opposed to the source electrode 12 but is opposed to a part of the gate pad 16.

Figure 2:
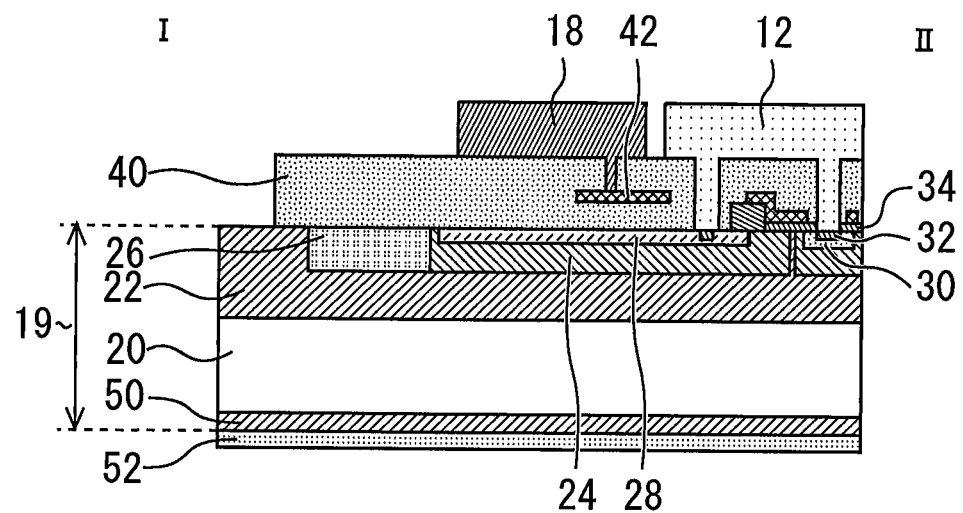
FIG. 2 is a cross-sectional view taken along the line I-II in FIG. 1.

FIG. 2 is a cross-sectional view taken along the line I-II in FIG. 1. A substrate 19 is made of silicon or a wide band gap semiconductor, for example. The wide band gap semiconductor is silicon carbide, a gallium nitride-based material, or diamond. The substrate 19 includes an n-type substrate 20. An $n^+$-type drain layer 50 is arranged under the n-type substrate 20, and an $n^-$-type drift layer 22 is arranged on the n-type substrate 20. A p-type well layer 24 and a termination structure 26 are arranged on the drift layer 22. The termination structure 26 is a field limiting structure, such as a guard ring or a field limiting plate.

An $n^{++}$-type high impurity concentration region 28 is arranged on the well layer 24 at a location directly below the gate wiring 18. The n-type impurity concentration of the high impurity concentration region 28 is higher than the n-type impurity concentration of the drift layer 22. In an example, the high impurity concentration region 28 may be formed to cover the entire area directly below the gate wiring 18. For example, if the substrate 19 is made of silicon carbide, the high impurity concentration region 28 containing one or both of nitride and phosphorus as an n-type impurity may be provided. The impurity concentration of the high impurity concentration region 28 is $1 \times 10^{18}$ $cm^{-3}$ to $1 \times 10^{21}$ $cm^{-3}$. In an example, the n-type impurity concentration of the high impurity concentration region 28 may be higher than the p-type impurity concentration of the well layer 24. An $n^+$-type source 30 is formed in the well layer 24. A p-type contact 32, which is in contact with the high impurity concentration region 28 described above and the source 30, is formed on the side of an upper surface of the substrate 19.

An interlayer insulating film 40 is provided on the upper surface of the substrate 19. The interlayer insulating film 40 is an oxide film or a nitride film, for example. In another example, the interlayer insulating film 40 may be made of SiON or $Al_2O_3$. The source electrode 12 is provided on the interlayer insulating film 40. The source electrode 12 is in contact with the contact 32 through a through-hole in the interlayer insulating film 40. The gate wiring 18 is also provided on the interlayer insulating film 40. The gate wiring 18 is in contact with polysilicon 42 provided in the interlayer insulating film 40.

Figure 3:
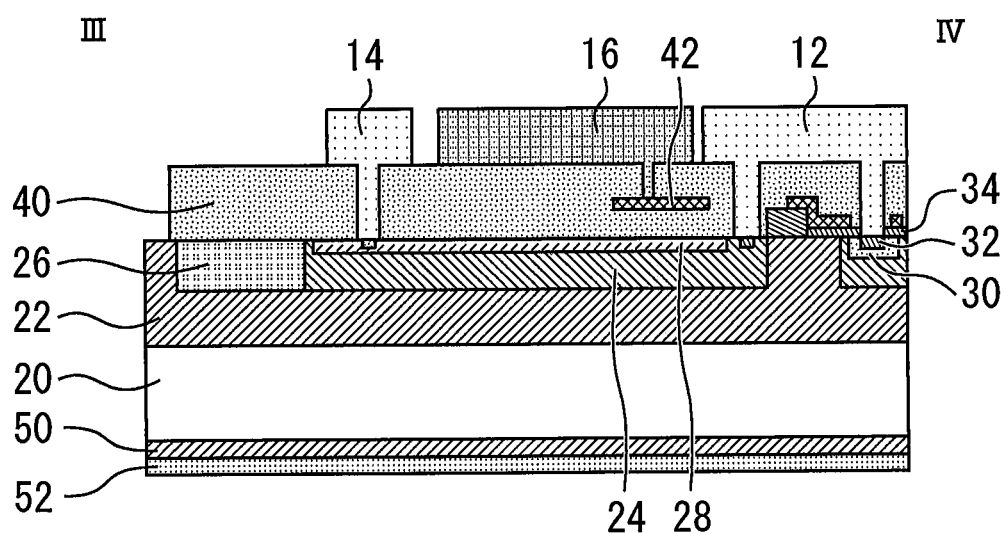
FIG. 3 is a cross-sectional view taken along the line III-IV in FIG. 1.

FIG. 3 is a cross-sectional view taken along the line III-IV in FIG. 1. The gate pad 16 is provided on the interlayer insulating film 40. The gate pad 16 is in contact with the polysilicon 42 provided in the interlayer insulating film 40. Therefore, the gate pad 16 and the gate wiring 18 are electrically connected to each other by the polysilicon 42.

The source wiring 14 is provided on the interlayer insulating film 40. The source wiring 14 is in contact with the contact 32 through a through-hole in the interlayer insulating film 40. The high impurity concentration region 28 is provided on the well layer 24 at a location directly below the gate pad 16. In an example, the high impurity concentration region 28 may be formed to cover the entire area directly below the gate pad 16.

With the semiconductor device according to the first embodiment, the high impurity concentration region 28, which has a low sheet resistance, is provided directly below the gate wiring 18 and the gate pad 16, and therefore, the voltage produced in these areas can be reduced. Therefore, damage to the device can be reduced even when fast switching, which involves high dV/dt, occurs. In addition, since the source wiring 14 is provided so that the source wiring 14 is opposed only to the gate pad 16, the ratio of the effective area to the chip area can be increased and the on-resistance can be reduced compared with when the source wiring is provided around the gate wiring.

The semiconductor device according to the first embodiment can be modified in various ways as far as the characteristics thereof are preserved. Provided that the n-type is referred to as a first conductivity type, and the p-type is referred to as a second conductivity type, the first conductivity type and the second conductivity type may be interchanged. When the conductivity types are interchanged, and the high impurity concentration region 28 is a p-type region, the high impurity concentration region 28 may contain one or both of aluminium and boron as a p-type impurity. The semiconductor devices according to the embodiments described below have much in common with the semiconductor device according to the first embodiment, and the following description of those embodiments will be focused on the differences from the first embodiment.

Second Embodiment

Figure 4:
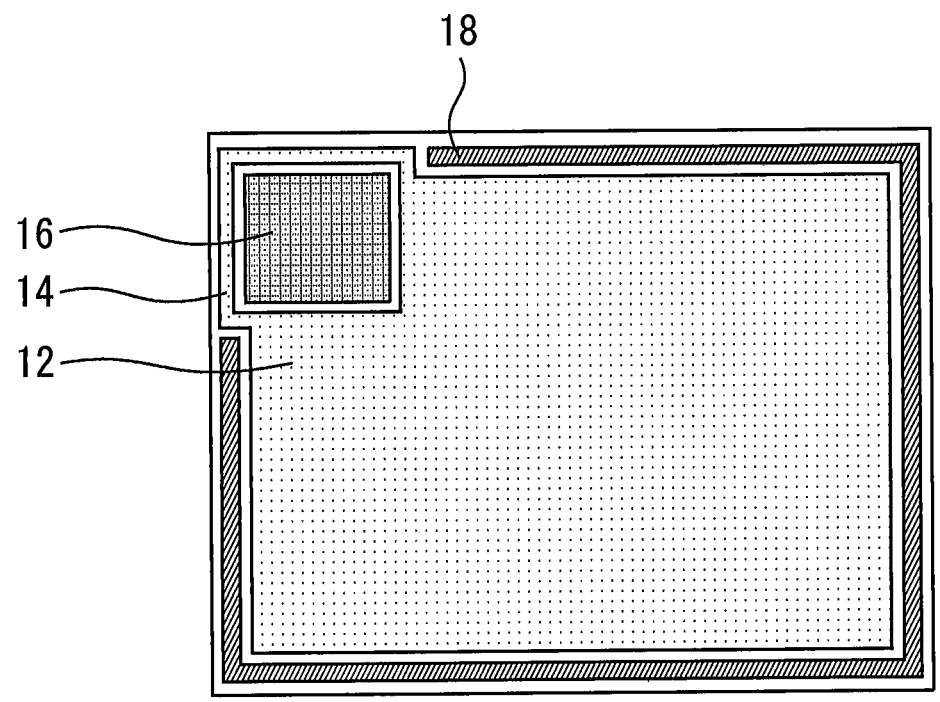
FIG. 4 is a plan view of a semiconductor device according to a second embodiment.

FIG. 4 is a plan view of a semiconductor device according to a second embodiment. The gate pad 16 is arranged at a corner of the source electrode 12. If the gate pad 16 is arranged at a corner of the source electrode 12, the ratio of the effective area to the chip area can be increased compared with the case where the gate pad 16 is otherwise arranged.

Third Embodiment

Figure 5:
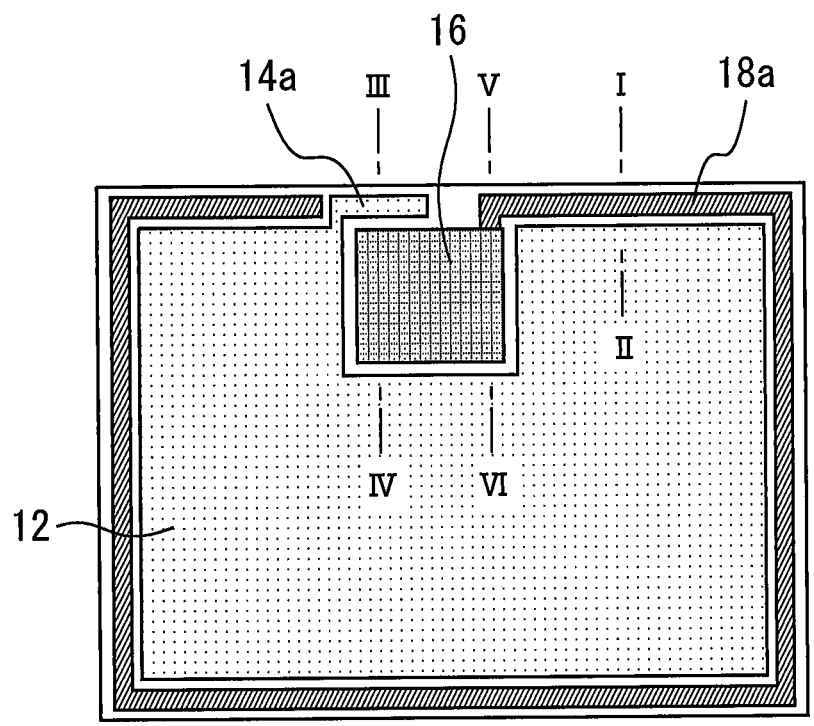
FIG. 5 is a plan view of a semiconductor device according to a third embodiment.

FIG. 5 is a plan view of a semiconductor device according to a third embodiment. Gate wiring 18a is in contact with the gate pad 16 at one end thereof. The gate wiring 18a is not in contact with the gate pad 16 at the other end. Source wiring 14a having a linear shape is in contact with the source electrode 12 at one end thereof and is not in contact with the source electrode 12 at the other end thereof. In a gap between the other end of the source wiring 14a and the source electrode 12, the gate wiring 18a and the gate pad 16 are connected to each other. In an example, the gate wiring 18a is in contact with an end of the gate pad 16. This ensures that the length for which the source wiring 14a and the gate pad 16 are opposed to each other can be increased.

Although the source wiring 14a and the source electrode 12 surround most of the gate part 16, the source wiring 14a and the source electrode 12 do not surround a part of the gate pad 16 since there is a gap between the source wiring 14a and the source electrode 12 as described above. The cross-sectional view taken along the line I-II in FIG. 5 is the same as that of FIG. 2, and the cross-sectional view taken along the line III-IV in FIG. 5 is the same as that of FIG. 3.

Figure 6:
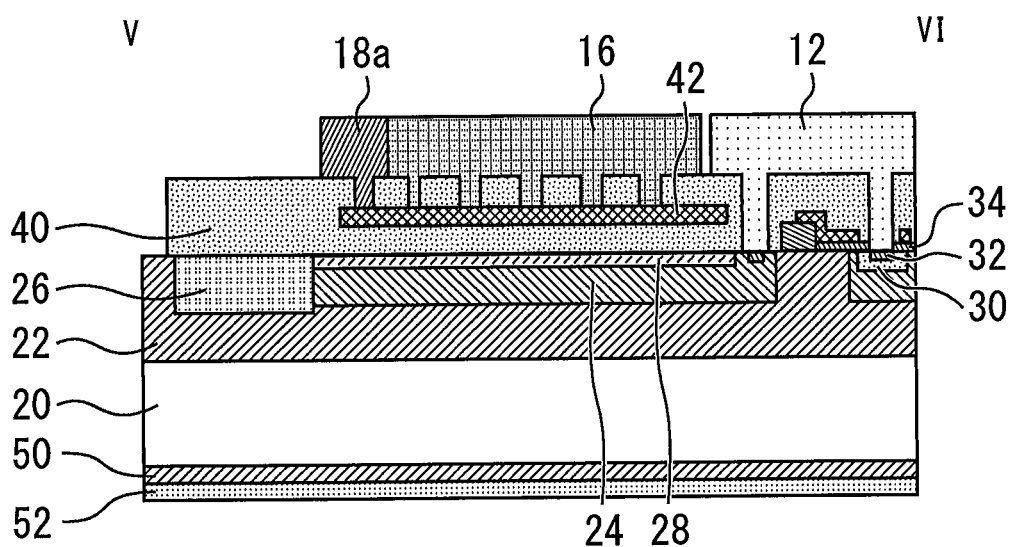
FIG. 6 is a cross-sectional view taken along the line V-VI in FIG. 5.

FIG. 6 is a cross-sectional view taken along the line V-VI in FIG. 5. There is the high impurity concentration region 28 directly below the gate wiring 18a and the gate pad 16. Therefore, the gate resistance can be reduced while reducing the voltage produced directly below the gate wiring 18a and the gate pad 16. That is, fast switching can be achieved with low switching loss.

Figure 7:
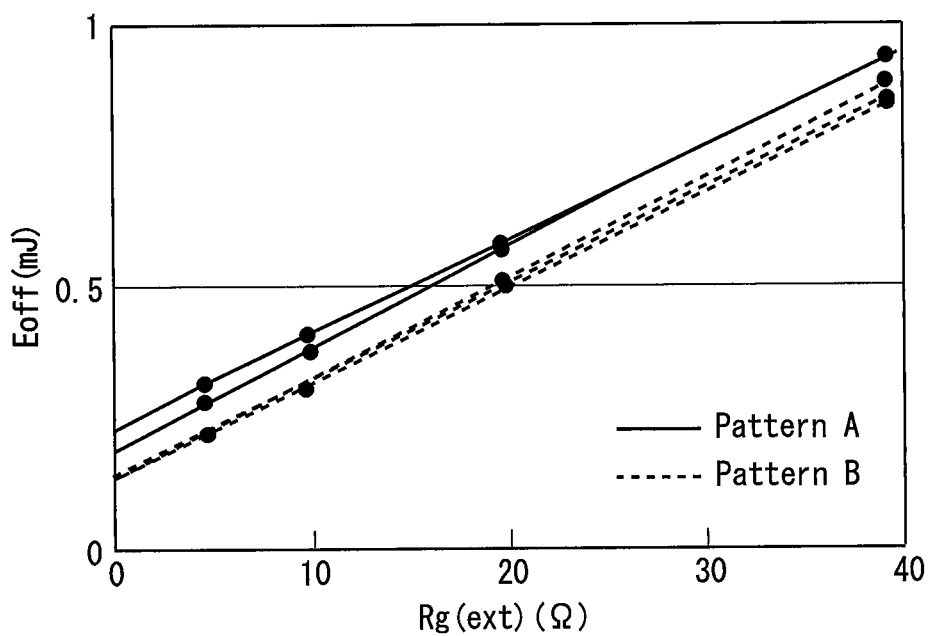
FIG. 7 is a graph showing switching losses of the semiconductor devices.
Figure 8:
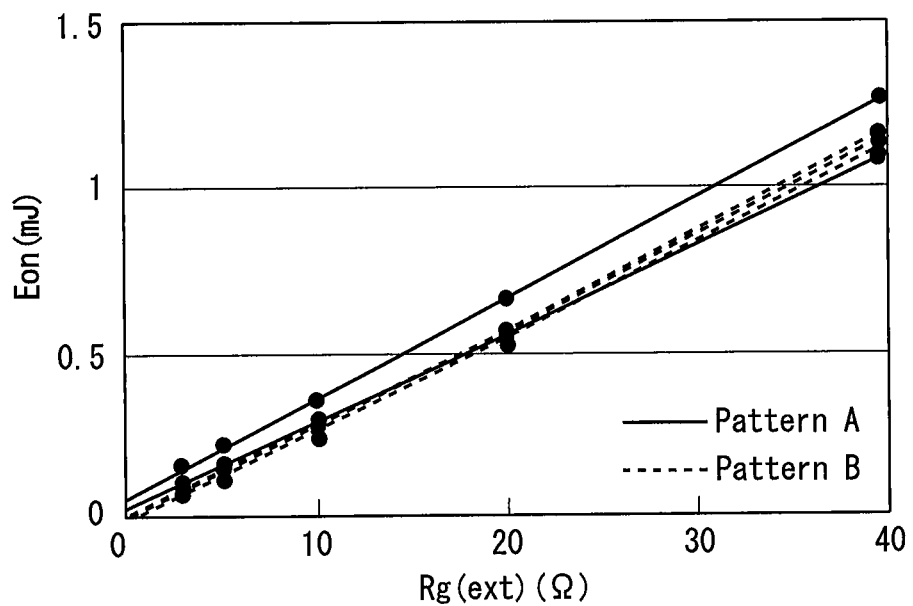
FIG. 8 is a graph showing switching losses of the semiconductor devices.

FIGS. 7 and 8 are graphs showing switching losses of the semiconductor devices according to the first and third embodiments for comparison. The result for the semiconductor device according to the first embodiment is shown as a pattern A, and the result for the semiconductor device according to the third embodiment is shown as a pattern B. $V_{GS}$ in the on state is 18V, and $V_{GS}$ in the off state is 0V. The junction temperature Tj is 150° C. The drain-source current Ids is 30 A. As can be seen from FIGS. 7 and 8, the switching loss is lower for the pattern B, in which the gate wiring 18a and the gate pad 16 are directly connected to each other.

Fourth Embodiment

Figure 9:
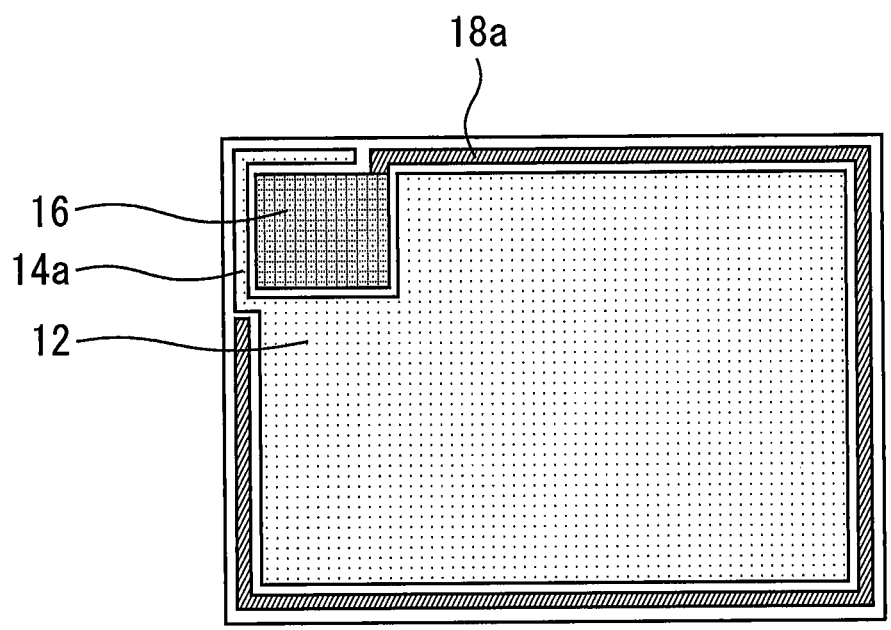
FIG. 9 is a plan view of a semiconductor device according to a fourth embodiment.

FIG. 9 is a plan view of a semiconductor device according to a fourth embodiment. The semiconductor device is similar in structure to the semiconductor device according to the third embodiment but differs from the semiconductor device according to the third embodiment in that the gate pad 16 is arranged at a corner of the source electrode 12. If the gate pad 16 is arranged at a corner of the source electrode 12, the ratio of the effective area to the chip area can be increased compared with the case where the gate pad 16 is otherwise arranged.

Fifth Embodiment

Figure 10:
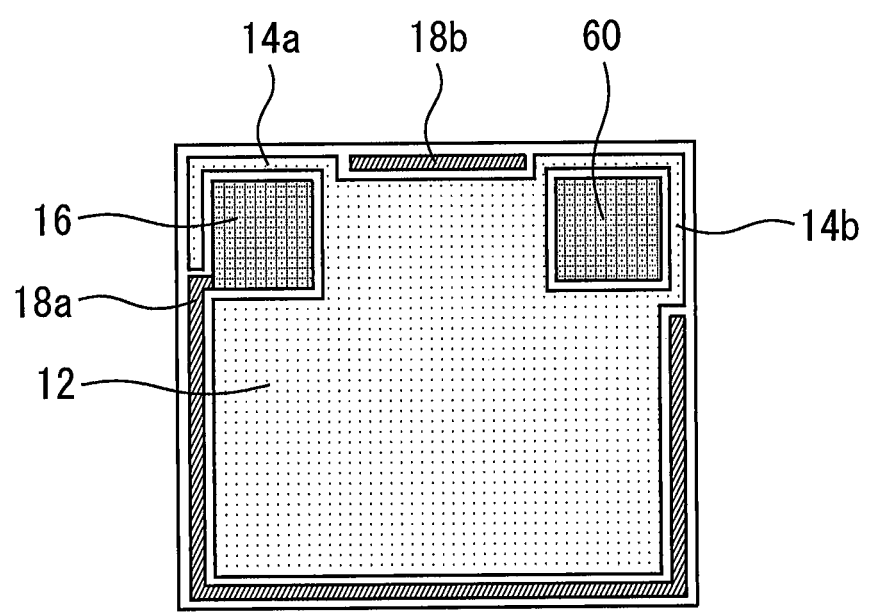
FIG. 10 is a plan view of a semiconductor device according to a fifth embodiment.

FIG. 10 is a plan view of a semiconductor device according to a fifth embodiment. The semiconductor device includes a current sensing pad 60. The current sensing pad 60 is provided on the substrate 19 with the interlayer insulating film interposed therebetween, and part of the principal current of the substrate 19 flows through the pad. A source extension part 14b having a linear shape is connected to the source electrode 12. The source extension part 14b is provided on the substrate, as with the source electrode 12. The high impurity concentration region described above can be provided directly below the source extension part 14b. In plan view, the source extension part 14b is not opposed to the source electrode 12 but is opposed to a part of the current sensing pad 60. That is, the current sensing pad 60 is surrounded by the source electrode 12 and the source extension part 14b.

With the structure described above, when fast switching, which involves high dV/dt, occurs, the risk of deterioration of the interlayer insulating film 4Q directly below the current sensing pad 60 can be reduced. Gate wiring 18b is provided to apply a voltage to a gate electrode in the proximity thereof.

Figure 11:
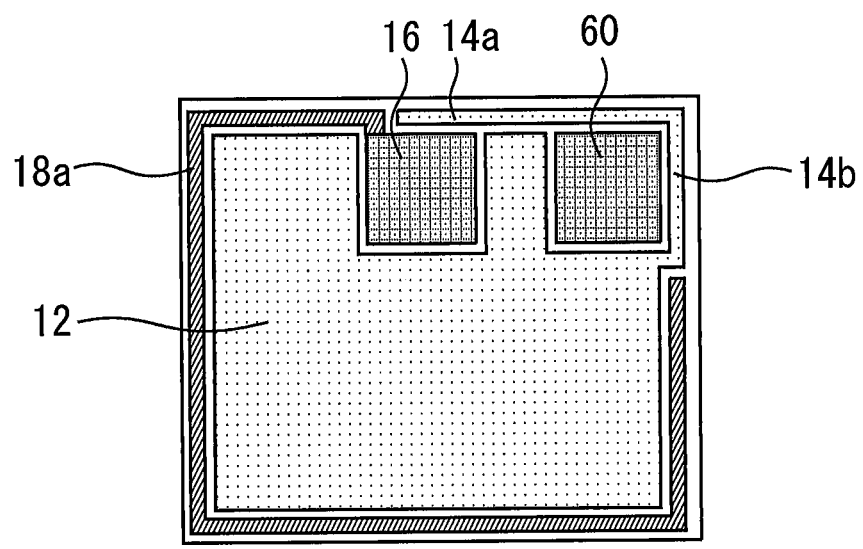
FIG. 11 is a plan view of a semiconductor device according to a modification.

FIG. 11 is a plan view of a semiconductor device according to a modification. In this example, the gate pad 16 is provided at a part other than any corner of the source electrode 12, and the current sensing pad 60 is provided at a corner of the source electrode 12. Therefore, the distance between the gate pad 16 and the current sensing pad 60 is short. In view of this, as shown in FIG. 11, the source wiring 14a and the source extension part 14b are formed as a single continuous part.

In the semiconductor device, a temperature sensing pad may be provided instead of the current sensing pad 60. The temperature sensing pad is provided on the substrate with the interlayer insulating film interposed therebetween. In that case, a temperature sensing diode is formed on the substrate, the temperature sensing pad is connected to the temperature sensing diode. Such a temperature sensing pad can be arranged in the same manner as the current sensing pad 60 shown in the plan views of FIGS. 10 and 11. In that case, in plan view, the source extension part 14b is not opposed to the source electrode 12 but is opposed to a part of the temperature sensing pad, so that the risk of deterioration of the interlayer insulating film can be reduced.

Sixth Embodiment

Figure 12:
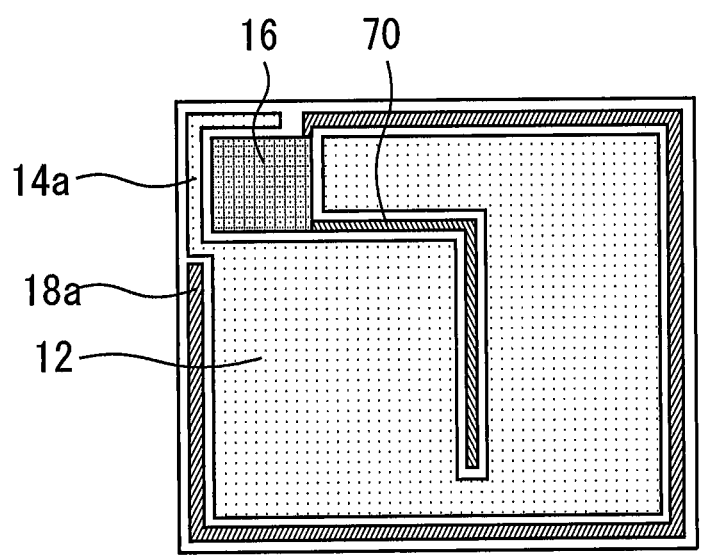
FIG. 12 is a plan view of a semiconductor device according to a sixth embodiment.

FIG. 12 is a plan view of a semiconductor device according to a sixth embodiment. A gate liner 70 is connected to the gate pad 16. The gate liner 70 is electrically connected to a plurality of gate electrodes provided in parallel with each other in the substrate. The gate liner 70 is made of Al, for example. The high impurity concentration region described above is provided directly below the gate liner 70 with the interlayer insulating film interposed therebetween. That is, the high impurity concentration region is provided directly below the gate pad 16, the gate wiring 18a and the gate liner 70. Therefore, the gate resistance can be reduced while reducing the voltage produced directly below the gate pad 16, the gate wiring 18a and the gate liner 70.

Figure 13:
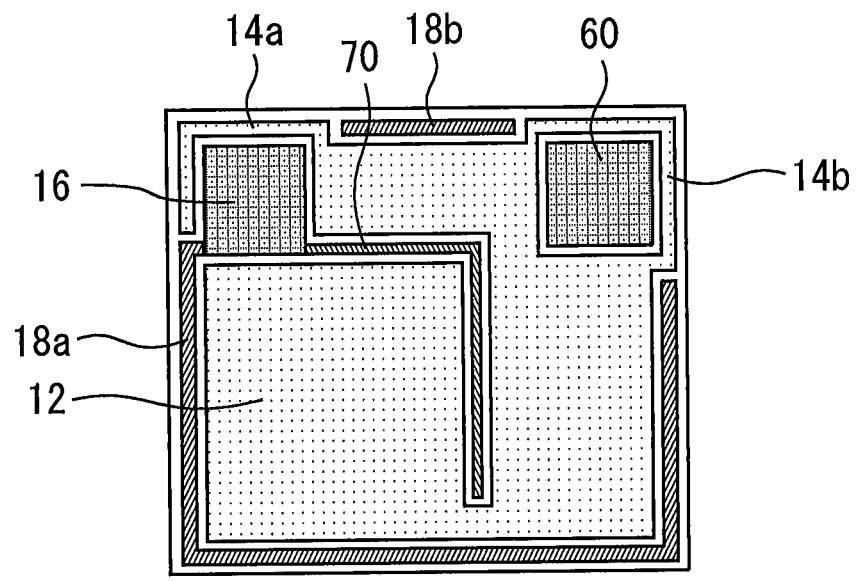
FIG. 13 is a plan view of a semiconductor device according to a modification.

FIG. 13 is a plan view of a semiconductor device according to a modification. The semiconductor device shown in FIG. 13 includes the current sensing pad 60 and the source extension part 14b described above with regard to the fifth embodiment. In this case, in addition to the voltage reduction effect, the risk of deterioration of the interlayer insulating film directly below the current sensing pad 60 can also be reduced.

Seventh Embodiment

Figure 14:
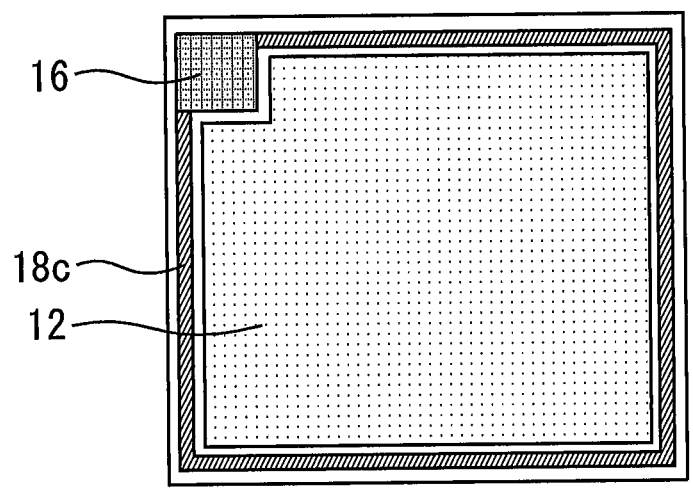
FIG. 14 is a plan view of a semiconductor device according to a seventh embodiment.

FIG. 14 is a plan view of a semiconductor device according to a seventh embodiment. The gate pad 16 has the shape of a rectangle the lengths of the sides of which are equal to or shorter than 400 μm. In plan view, the source electrode 12 is opposed to a part of the gate pad. In plan view, gate wiring 18c surrounds the whole of the source electrode 12 and is in contact with the gate pad 16. More specifically, the gate wiring 18c is in contact with an upper right part of the gate pad 16 at one end thereof and with a lower left part of the gate pad 16 at the other end thereof. The high impurity concentration region is provided on the well layer at a location directly below the gate pad 16.

The semiconductor device according to the seventh embodiment has no source wiring. When the small gate pad 16 the lengths of the sides of which are equal to or shorter than 400 μm is used, deterioration of the interlayer insulating film directly below the gate pad can be reduced even if no source wiring is opposed to the gate pad. More specifically, under fast switching conditions that dV/dt 150 kV/μs, no source wiring needs to be opposed to the gate pad. Therefore, according to the seventh embodiment, the gate resistance can be reduced by directly connecting the gate pad 16 and the gate wiring 18c to each other, and the ratio of the effective area to the chip area can be increased by omitting any source wiring. The characteristics of the semiconductor devices according to the embodiments described above may be used in any combination.

In some examples, the size of the source wiring is not increased, and the high impurity concentration region having a higher impurity concentration than the drift layer is formed on the surface of the substrate at a location directly below the gate pad or the like. Therefore, the ratio of the effective area to the chip area can be increased, and deterioration of the interlayer insulating film directly below the gate pad or the like can be reduced.

The invention claimed is:

1. A semiconductor device, comprising:
   a substrate;
   an interlayer insulating film provided on the substrate;
   a gate pad provided on the interlayer insulating film;
   a source electrode that is provided on the interlayer insulating film and is opposed to a part of the gate pad in plan view;
   source wiring having a linear shape that is provided on the interlayer insulating film, is not opposed to the source electrode but is opposed to a part of the gate pad in plan view, and is connected to the source electrode; and
   gate wiring that is provided on the interlayer insulating film and is electrically connected to the gate pad,
   wherein the substrate includes a drift layer of a first conductivity type, a well layer of a second conductivity type provided on the drift layer, and a high impurity concentration region provided on the well layer at a location directly below the gate wiring and the gate pad,
   the first conductivity type impurity concentration of the high impurity concentration region is higher than the first conductivity type impurity concentration of the drift layer, and
   the source wiring and the gate wiring provide one frame that surrounds the source electrode in plan view.

2. The semiconductor device according to claim 1, further comprising:
   polysilicon that is provided in the interlayer insulating film and connects the gate pad and the gate wiring to each other,
   wherein the source wiring is in contact with the source electrode at opposite ends thereof in plan view.

3. The semiconductor device according to claim 1, wherein the gate pad is arranged at a corner of the source electrode.

4. The semiconductor device according to claim 1, wherein the gate wiring is in contact with the gate pad at one end thereof.

5. The semiconductor device according to claim 4, wherein the gate wiring is in contact with an end of the gate pad.

6. The semiconductor device according to claim 4, wherein the gate pad is arranged at a corner of the source electrode.

7. The semiconductor device according to claim 1, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

8. The semiconductor device according to claim 1, further comprising:
   a temperature sensing diode that is provided on the substrate;
   a temperature sensing pad that is provided on the substrate and is in contact with the temperature sensing diode; and
   a source extension part having a linear shape that is provided on the substrate, is not opposed to the source electrode but is opposed to a part of the temperature sensing pad in plan view, and is connected to the source electrode.

9. The semiconductor device according to claim 1, further comprising:
   a gate liner connected to the gate pad,
   wherein the high impurity concentration region is provided directly below the gate liner.

10. The semiconductor device according to claim 1, wherein the substrate is made of a wide band gap semiconductor.

11. The semiconductor device according to claim 10, wherein the wide band gap semiconductor is silicon carbide, a gallium nitride-based material, or diamond.

12. The semiconductor device according to claim 2, wherein the gate pad is arranged at a corner of the source electrode.

13. The semiconductor device according to claim 5, wherein the gate pad is arranged at a corner of the source electrode.

14. The semiconductor device according to claim 2, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

15. The semiconductor device according to claim 3, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

16. The semiconductor device according to claim 4, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

17. The semiconductor device according to claim 5, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

18. The semiconductor device according to claim 6, further comprising:
   a current sensing pad that is provided on the substrate, the current sensing pad is configured to pass a part of a principal current of the substrate; and
   a source extension part having a linear shape that is provided on the substrate, is not opposed to the source electrode but is opposed to a part of the current sensing pad in plan view, and is connected to the source electrode.

19. The semiconductor device according to claim 2, further comprising:
   a temperature sensing diode that is provided on the substrate;
   a temperature sensing pad that is provided on the substrate and is in contact with the temperature sensing diode; and
   a source extension part having a linear shape that is provided on the substrate, is not opposed to the source electrode but is opposed to a part of the temperature sensing pad in plan view, and is connected to the source electrode.

* * * * *